United States Patent
Pak et al.

(10) Patent No.: US 12,289,939 B2
(45) Date of Patent: Apr. 29, 2025

(54) DISPLAY DEVICE

(71) Applicant: LG DISPLAY CO., LTD., Seoul (KR)

(72) Inventors: Sang Hoon Pak, Seoul (KR); Tae Gyu Lee, Paju-si (KR); Seon Hee Lee, Seoul (KR); Jung Eun Lee, Seoul (KR); Kyung Ha Lee, Seoul (KR)

(73) Assignee: LG Display Co., Ltd. (KR)

( * ) Notice: Subject to any disclaimer, the term of this patent is extended or adjusted under 35 U.S.C. 154(b) by 462 days.

(21) Appl. No.: 17/536,142

(22) Filed: Nov. 29, 2021

(65) Prior Publication Data
US 2022/0173160 A1 Jun. 2, 2022

(30) Foreign Application Priority Data
Nov. 30, 2020 (KR) .................. 10-2020-0163837

(51) Int. Cl.
| | |
|---|---|
| *H10H 29/14* | (2025.01) |
| *H10D 30/67* | (2025.01) |
| *H10H 20/821* | (2025.01) |
| *H10H 20/831* | (2025.01) |
| *H10H 20/84* | (2025.01) |
| *H10H 20/851* | (2025.01) |
| *H10H 20/855* | (2025.01) |

(52) U.S. Cl.
CPC ...... *H10H 29/142* (2025.01); *H10D 30/6723* (2025.01); *H10H 20/821* (2025.01); *H10H 20/831* (2025.01); *H10H 20/84* (2025.01); *H10H 20/8515* (2025.01); *H10H 20/855* (2025.01)

(58) Field of Classification Search
None
See application file for complete search history.

(56) References Cited

U.S. PATENT DOCUMENTS

| | | | | |
|---|---|---|---|---|
| 2017/0139268 | A1* | 5/2017 | Liu | G03F 7/105 |
| 2019/0326348 | A1* | 10/2019 | Im | H01L 27/156 |
| 2021/0265324 | A1* | 8/2021 | Kong | H10K 59/131 |
| 2021/0367104 | A1* | 11/2021 | Yun | H01L 25/167 |
| 2022/0028922 | A1* | 1/2022 | Park | H01L 33/382 |
| 2022/0122956 | A1* | 4/2022 | Yun | H01L 33/44 |
| 2022/0165787 | A1* | 5/2022 | Lee | H01L 33/60 |

FOREIGN PATENT DOCUMENTS

KR 10-2022-0031781 A 3/2022

OTHER PUBLICATIONS

Korean Office Action dated Sep. 9, 2024 issued in Patent Application No. 10-2020-0163837 (6 pages).

* cited by examiner

*Primary Examiner* — Sarah K Salerno
(74) *Attorney, Agent, or Firm* — Fish & Richardson P.C.

(57) ABSTRACT

A display device includes first and second alignment electrodes disposed on a substrate, an alignment insulating film having a concave portion disposed between the first and second alignment electrodes, a light-emitting device disposed on the alignment insulating film, first and second electrodes electrically connected to the light-emitting device, a thin-film transistor connected to one of the first and second electrodes, and a plurality of insulating films providing a trench disposed on the concave portion, the trench having a larger width than the concave portion, thereby improving emission efficiency.

23 Claims, 14 Drawing Sheets

DISPLAY DEVICE

CROSS-REFERENCE TO RELATED APPLICATION

This application claims the benefit of Korean Patent Application No. 10-2020-0163837, filed on Nov. 30, 2020, which is hereby incorporated by reference in its entirety as if fully set forth herein.

BACKGROUND

Field of the Disclosure

The present disclosure relates to a display device, and more particularly to a display device capable of exhibiting improved a light emission efficiency.

Description of the Background

Nowadays, with the advent of information society, the requirements for display devices for representing information are increasing. Various types of display devices, such as liquid crystal display devices, plasma display devices, and organic light-emitting display devices, have been used. Recently, a display device using a micro light-emitting diode (μLED) has been developed. The micro light-emitting diode is an ultra-small light-emitting diode having a size of several tens of micrometers (μm) or less.

Since a display device using a micro light-emitting diode can be miniaturized and made lightweight, it can be variously used in smartwatches, mobile devices, virtual-reality devices, augmented-reality devices, flexible display devices, etc. In addition, because a display device including a micro light-emitting diode is a highly efficient low-power device, the lifespan thereof is long, warmup time is not required, and the turn-on speed and the turn-off speed thereof are very high.

However, a display device including a micro light-emitting diode has a structural problem in which it is difficult to concentrate side light, diffused to the side surface of the light-emitting diode, in the front direction of the display device and in which a hole-electron recombination path is limited to a linear path, which deteriorates the light emission efficiency.

SUMMARY

Accordingly, the present disclosure is directed to a display device that substantially obviates one or more problems due to limitations and disadvantages of the background art.

More specifically, the present disclosure is to provide a display device capable of exhibiting improved emission efficiency.

Additional advantages and features of the disclosure will be set forth in part in the description which follows and in part will become apparent to those having ordinary skill in the art upon examination of the following or may be learned from practice of the disclosure. Other advantages of the disclosure may be realized and attained by the structure particularly pointed out in the written description and claims hereof as well as the appended drawings.

To achieve these and other advantages and in accordance with the disclosure, as embodied and broadly described herein, a display device includes first and second alignment electrodes disposed on a substrate, an alignment insulating film having a concave portion disposed between the first and second alignment electrodes, a light-emitting device disposed on the alignment insulating film, first and second electrodes electrically connected to the light-emitting device, a thin-film transistor connected to one of the first and second electrodes, and a plurality of insulating films providing a trench disposed on the concave portion, the trench having a larger width than the concave portion.

In another aspect of the present disclosure, a display device includes first and second alignment electrodes disposed on a substrate; a plurality of insulating layers disposed on the first and second alignment electrodes; a light-emitting device disposed on or having a portion embedded in the plurality of insulating layers; first and second electrodes electrically connected to the light-emitting device; and a thin-film transistor electrically connected to one of the first and second electrodes, wherein the plurality of insulating layers has a trench directing the light-emitting device to a viewer direction and a concave portion is extended from the trench and exposes the light-emitting device to a direction opposite to the viewer direction, and wherein the concave portion is disposed between the first and second alignment electrodes and under the light-emitting device and the light-emitting device has a portion vertically overlapping with the first and second alignment electrodes.

The trench may overlap with the concave portion and may not overlap with the thin-film transistor.

The alignment insulating film may include a protective film disposed on the thin-film transistor. The plurality of insulating films may include a buffer layer disposed under an active layer of the thin-film transistor, a gate insulating film disposed between the active layer of the thin-film transistor and a gate electrode of the thin-film transistor, and an interlayer insulating film disposed between source and drain electrodes of the thin-film transistor and the gate electrode of the thin-film transistor.

The trench may expose side surfaces of the buffer layer, the gate insulating film, and the interlayer insulating film and an upper surface of the substrate. The concave portion may be defined by a curved surface of the protective film corresponding to the space between the first and second alignment electrodes.

The display device may further include a light-blocking layer overlapping with the active layer of the thin-film transistor. The first and second alignment electrodes may be formed of the same material and in the same plane as the light-blocking layer.

The trench may expose side surfaces of the interlayer insulating film and an upper surface of the gate insulating film. The concave portion may be defined by a curved surface of the protective film corresponding to the space between the first and second alignment electrodes.

The first and second alignment electrodes may be formed of the same material and in the same plane as the gate electrode of the thin-film transistor.

The trench may overlap with the concave portion and the thin-film transistor.

The alignment insulating film may include a planarization layer disposed on the thin-film transistor, and the concave portion may expose an inner surface and side surfaces of the planarization layer.

The concave portion may be disposed between the first and second alignment electrodes in the longitudinal direction of the first and second alignment electrodes. The concave portion may be provided in a plurality thereof in each subpixel.

A convex portion may be disposed between the plurality of concave portions. The convex portion may extend in the longitudinal direction of the first and second alignment electrodes and may overlap with the first and second alignment electrodes.

The concave portion may be provided in a plurality thereof in each subpixel, and the plurality of concave portions may intersect the first and second alignment electrodes in the width direction of the first and second alignment electrodes.

A convex portion may be disposed between the plurality of concave portions. The convex portion may extend in the width direction of the first and second alignment electrodes.

The light-emitting device may be disposed on the upper surface of the alignment insulating film so as to be spaced apart from the inner surface of the alignment insulating film defining the concave portion.

The light-emitting device may be disposed in the concave portion so as to face the inner surface and the inner side surfaces of the alignment insulating film defining the concave portion.

The light-emitting device may be disposed at an incline within the concave portion.

The first and second alignment electrodes may be disposed on the side surfaces of at least one of the plurality of insulating films exposed by the trench.

The first and second electrodes may fill the spaces between the light-emitting device and the side surfaces of at least one of the plurality of insulating films exposed by the trench.

The display device may further include a plurality of color layers, disposed on at least one of the upper surface or the lower surface of the substrate, and a black matrix, disposed between the plurality of color layers and overlapping with the thin-film transistor.

The plurality of color layers disposed on the upper surface of the substrate may be embedded in the trench.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

Reference will now be made in detail to exemplary aspects of the present disclosure, examples of which are illustrated in the accompanying drawings.

Figure 1:
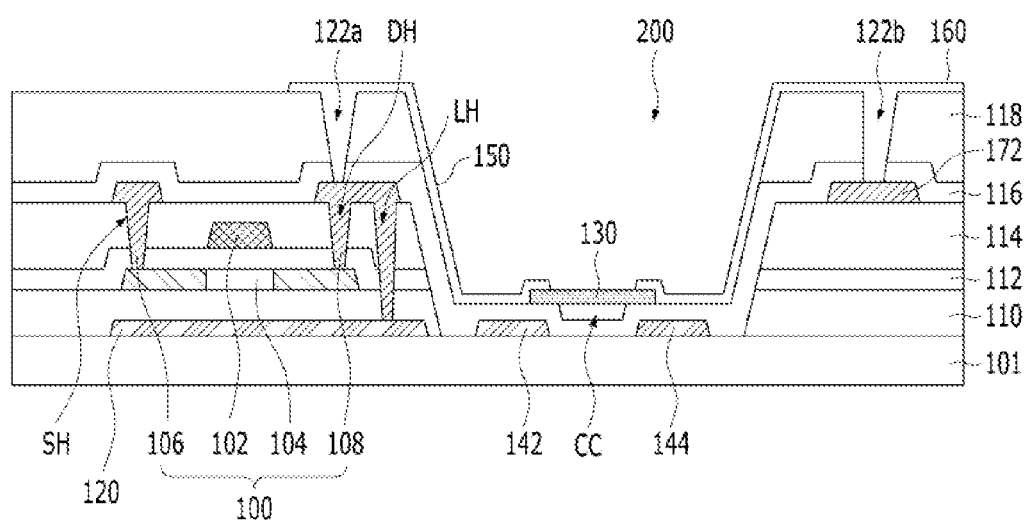
FIG. 1 is a cross-sectional view showing a display device according to a first aspect of the present disclosure.

FIG. 1 is a cross-sectional view showing one subpixel of a display device according to the present disclosure.

Each subpixel of the display device shown in FIG. 1 may include a thin-film transistor 100, first and second electrodes 150 and 160, first and second alignment electrodes 142 and 144, and a light-emitting device 130 having a size of several tens of micrometers (μm) or less.

Figure 2A:
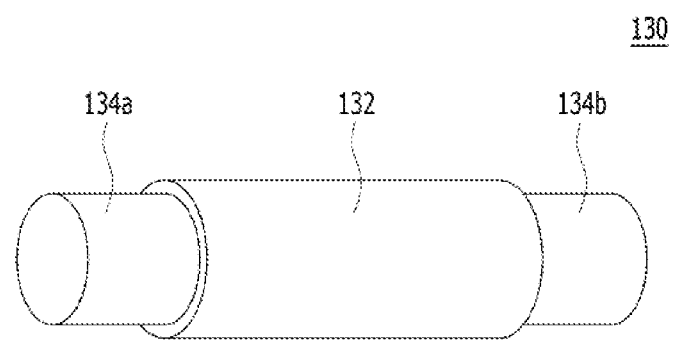
FIGS. 2A and 2B are respectively a perspective view and a cross-sectional view showing the light-emitting device shown in FIG. 1.
Figure 2B:
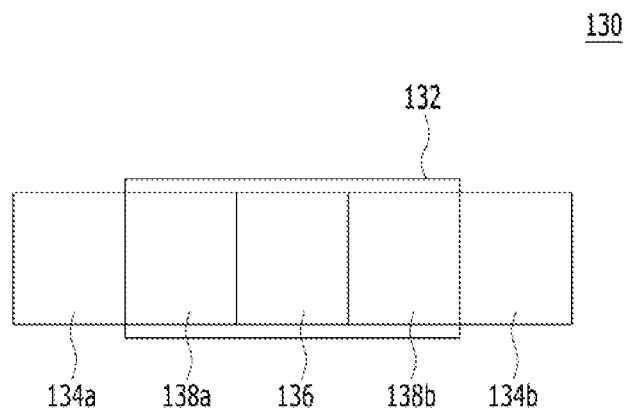

As shown in FIGS. 2A and 2B, the light-emitting device 130 may include first and second light-emitting electrodes 134a and 134b, first and second semiconductor layers 138a and 138b, an active layer 136, and an outer protective film 132.

The first and second light-emitting electrodes 134a and 134b may be formed of a conductive material including at least one of molybdenum (Mo), copper (Cu), aluminum (Al), titanium (Ti), chromium (Cr), silver (Ag), gold (Au), nickel (Ni), neodymium (Nd), or tungsten (W) or an alloy thereof. The first light-emitting electrode 132a is electrically connected to one of the first and second electrodes 150 and 160 through an alignment process performed on the light-emitting device 130, and the second light-emitting electrode 134b is electrically connected to the other one of the first and second electrodes 150 and 160 through the alignment process performed on the light-emitting device 130.

The first ohmic contact layer 138a includes at least one n-type semiconductor layer. For example, the first ohmic contact layer 138a may include at least one semiconductor material including one of indium aluminum gallium nitride (InAlGaN), gallium nitride (GaN), aluminum gallium nitride (AlGaN), indium gallium nitride (InGaN), aluminum nitride (AlN), and indium nitride (InN), and may include a semiconductor layer doped with a first conductive dopant such as silicon (Si), germanium (Ge), and tin (Sn).

The active layer 136 is formed in a single-quantum-well structure or a multi-quantum-well structure on the first ohmic contact layer 138a. A cladding layer doped with a conductive dopant may be formed on at least one of the upper surface or the lower surface of the active layer 136. The cladding layer is formed as, for example, an aluminum gallium nitride (AlGaN) layer or an indium aluminum gallium nitride (InAlGaN) layer. In addition, a material such as aluminum gallium nitride (AlGaN) and indium aluminum gallium nitride (InAlGaN) may also be used for the active layer 136. When an electric field having a predetermined voltage or higher is applied to the first and second light-emitting electrodes 134a and 134b of the light-emitting device 130, the light-emitting device 130 emits light due to the combination of electron-hole pairs in the active layer 136.

The second ohmic contact layer 138b is formed on the active layer 136, and includes at least one p-type semiconductor layer, which is of a different type from the first ohmic contact layer 138a. For example, the second ohmic contact layer 138b may include at least one semiconductor material including one of indium aluminum gallium nitride (InAlGaN), gallium nitride (GaN), aluminum gallium nitride (AlGaN), indium gallium nitride (InGaN), aluminum nitride (AlN), and indium nitride (InN), and may include a semiconductor layer doped with a second conductive dopant such as magnesium (Mg).

The outer protective film 132 may be formed so as to cover the outer peripheral surface of each of the first and second ohmic contact layers 138a and 138b and the active layer 136, except for the first and second light-emitting electrodes 134a and 134b, so that the first and second light-emitting electrodes 134a and 134b are exposed. The outer protective film 132 may be formed of a transparent insulating material so that light emitted from the active layer 136 is radiated therethrough. For example, the outer protective film 132 may be formed of at least one insulating material including one of silicon dioxide (SiO2), silicon nitride (Si3N4), aluminum oxide (Al2O3), and titanium dioxide (TiO2).

The outer protective film 132 can prevent contact between the active layer 136 and conductive layers disposed around the light-emitting device 130, thereby preventing the occurrence of a short circuit between the same. In addition, since the outer protective film 132 is disposed so as to surround the outer peripheral surface of the light-emitting device 130, it is possible to minimize surface defects of the light-emitting device 130, thereby improving the lifespan and efficiency of the light-emitting device 130.

As shown in FIG. 1, the thin-film transistor 100 may include a pixel semiconductor layer 104 disposed on a buffer layer 110, a gate electrode 102 overlapping with the pixel semiconductor layer 104, with a gate insulating film 112 interposed therebetween, and source and drain electrodes 106 and 108 formed on an interlayer insulating film 114 so as to be in contact with the pixel semiconductor layer 104.

The pixel semiconductor layer 104 is formed of at least one of an amorphous semiconductor material, a polycrystalline semiconductor material, and an oxide semiconductor material. The pixel semiconductor layer 104 is formed on the buffer layer 110. The pixel semiconductor layer 104 includes a channel region, a source region, and a drain region. The channel region overlaps with the gate electrode 102, with the gate insulating film 112 interposed therebetween, and is formed between the source and drain electrodes 106 and 108. The source region is exposed through a source contact hole SH, which penetrates the gate insulating film 112 and the interlayer insulating film 114, and is electrically connected to the source electrode 106. The drain region is exposed through a drain contact hole DH, which penetrates the gate insulating film 112 and the interlayer insulating film 114, and is electrically connected to the drain electrode 108. A light-blocking layer 120 is disposed between the pixel semiconductor layer 104 and a substrate 101. The light-blocking layer 120 may overlap with the pixel semiconductor layer 104. Since the light-blocking layer 120 absorbs or reflects light incident thereon from the rear surface of the substrate 101, it is possible to prevent or minimize the incidence of light on the channel region of the pixel semiconductor layer 104. The light-blocking layer 120 may be formed in a single-layered structure or a multi-layered structure using an opaque metal including at least one of molybdenum (Mo), copper (Cu), aluminum (Al), titanium (Ti), chromium (Cr), silver (Ag), gold (Au), nickel (Ni), neodymium (Nd), and tungsten (W) or an alloy thereof.

The gate electrode 102 is formed on the gate insulating film 112, and overlaps with the channel region of the pixel semiconductor layer 104, with the gate insulating film 112 interposed therebetween. The gate electrode 102 may be formed in a single-layered structure or a multi-layered structure using a first conductive material including at least one of molybdenum (Mo), copper (Cu), aluminum (Al), titanium (Ti), chromium (Cr), silver (Ag), gold (Au), nickel (Ni), neodymium (Nd), and tungsten (W) or an alloy thereof.

The source electrode 106 may be connected to the source region of the pixel semiconductor layer 104, which is exposed through the source contact hole SH, which penetrates the gate insulating film 112 and the interlayer insulating film 114.

The drain electrode 108 may face the source electrode 106, and may be connected to the drain region of the pixel semiconductor layer 104 through the drain contact hole DH, which penetrates the gate insulating film 112 and the interlayer insulating film 114.

The drain electrode 108 may be connected to the light-blocking layer 120 through a light-blocking contact hole LH, which penetrates the buffer layer 110, the gate insulating film 112, and the interlayer insulating film 114. Since the light-blocking layer 120 connected to the drain electrode 108 does not operate as a floating gate, it is possible to prevent the occurrence of body effect such as a change in the threshold voltage of the thin-film transistor, which is caused by the floated light-blocking layer 120.

Each of the source and drain electrodes 106 and 108 may be formed in a single-layered structure or a multi-layered structure using a second conductive material including at least one of molybdenum (Mo), copper (Cu), aluminum (Al), titanium (Ti), chromium (Cr), silver (Ag), gold (Au), nickel (Ni), neodymium (Nd), and tungsten (W) or an alloy thereof.

The first electrode 150 may be connected to the first light-emitting electrode 134a of the light-emitting device 130 to serve as an anode. The first electrode 150 may be in contact with the drain electrode 108 of the thin-film transistor, which is exposed through a first contact hole 122a, which penetrates a protective film 116 and a planarization layer 118.

The second electrode 160 may be connected to the second light-emitting electrode 134b of the light-emitting device 130 to serve as a cathode. The second electrode 160 may be in contact with a low-voltage (VSS) supply line 172, which is exposed through a second contact hole 122b, which penetrates the protective film 116 and the planarization layer 118.

The first and second electrodes 150 and 160 are formed of a conductive material having high reflectivity. For example, each of the first and second electrodes 150 and 160 may be formed in a single-layered structure or a multi-layered structure using a conductive material including at least one of molybdenum (Mo), aluminum (Al), chromium (Cr), gold (Au), silver (Ag), titanium (Ti), nickel (Ni), neodymium (Nd), tungsten (W), and copper (Cu) or an alloy thereof.

Accordingly, the first and second electrodes 150 and 160 reflect light traveling in a direction different from the direction oriented toward the emission area overlapping with a trench 200 (i.e. the front direction in which the screen is displayed), among the light beams emitted from the light-emitting device 130, to the emission area, thereby improving the efficiency of emission of light in the front direction. In addition, the first and second electrodes 150 and 160 reflect light traveling to the thin-film transistor 100 to the emission area, thereby preventing deterioration in the reliability of the thin-film transistor 100.

The first and second alignment electrodes 142 and 144 may be disposed between the protective film 116 and the portion of the substrate 101 that is exposed by the trench 200.

Figure 3:
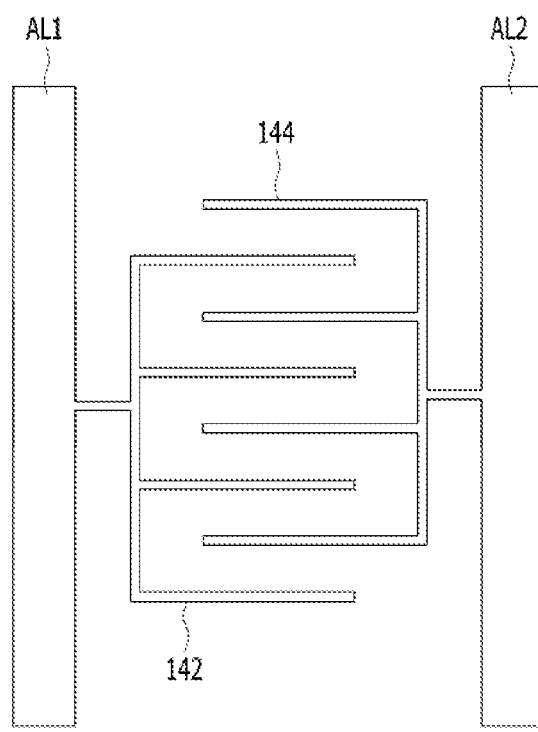
FIG. 3 is a plan view showing the alignment electrodes shown in FIG. 1 and the alignment signal lines connected to the alignment electrodes.

The first alignment electrode 142 may be disposed on the substrate 101, and may overlap with the first light-emitting electrode 134a of the light-emitting device 130, with the protective film 116 interposed therebetween. As shown in FIG. 3, the first alignment electrode 142 may be formed so as to protrude in a finger shape from a first alignment signal line AL1. For example, the first alignment signal line AL1 may extend in a Y-axis direction, and the first alignment electrode 142 may protrude from the first alignment signal line AL1 in an X-axis direction.

The second alignment electrode 144 may be disposed on the substrate 101, and may overlap with the second light-emitting electrode 134b of the light-emitting device 130, with the protective film 116 interposed therebetween. The second alignment electrode 144 may be formed so as to protrude in a finger shape from a second alignment signal line AL2, which is disposed parallel to the first alignment signal line AL1. For example, the second alignment signal line AL2 may extend in the Y-axis direction, which is parallel to the first alignment signal line AL1, and the second alignment electrode 144 may protrude from the second alignment signal line AL2 in the X-axis direction. In addition, as shown in FIG. 3, the second alignment electrode 144 may be disposed parallel to the first alignment electrode 142. In addition, the second alignment electrode 144, which is disposed parallel to the first alignment electrode 142, may be alternately disposed with the first alignment electrode 142 in each subpixel.

Figure 4A:
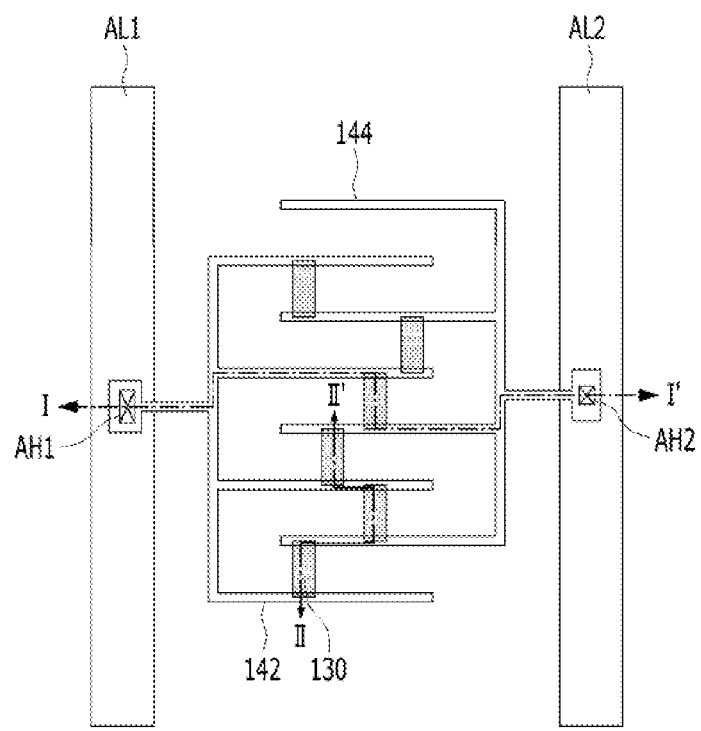
FIG. 4A is a plan view showing another aspect of the alignment signal lines shown in FIG. 3.
Figure 4B:
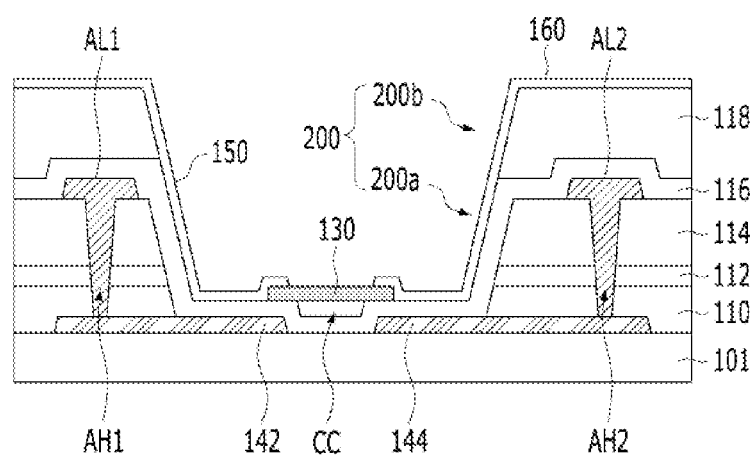
FIGS. 4B and 4C are cross-sectional views taken along line I-I' in FIG. 4A.

The first and second alignment electrodes 142 and 144 may be disposed on the substrate 101, and may be formed of the same material as the light-blocking layer 120. The first and second alignment signal lines AL1 and AL2 may be formed of the same material and in the same layer as the first and second alignment electrodes 142 and 144. Alternatively, as shown in FIGS. 4A and 4B, the first and second alignment signal lines AL1 and AL2 may be formed of a different material and in a different layer from the first and second alignment electrodes 142 and 144.

For example, the first and second alignment signal lines AL1 and AL2 may be formed of the same material as the source and drain electrodes 106 and 108. In addition, the first and second alignment signal lines AL1 and AL2 may be disposed on the interlayer insulating film 114, like the source and drain electrodes 106 and 108. In addition, the first and second alignment signal lines AL1 and AL2 may be connected to the first and second alignment electrodes 142 and 144 through first and second alignment contact holes AH1 and AH2, which penetrate the buffer layer 110, the gate insulating film 112, and the interlayer insulating film 114. The second alignment signal line AL2 may be used as the low-voltage signal line 172 when representing an image.

In the display device according to the aspect, the light-emitting device 130 may be disposed in the trench 200, which does not overlap with the thin-film transistor 100. As shown in FIG. 4B, the trench 200 may include a first trench 200a, which penetrates the buffer layer 110, the gate insulating film 112, and the interlayer insulating film 114, and a second trench 200b, which penetrates the planarization layer 118. The side surfaces of the plurality of insulating films 110, 112, 114, 116 and 118 that are exposed by the first and second trenches 200a and 200b are formed in the shape of a cup having an inclined surface, so the trench 200 may be formed such that the width thereof gradually increases from the buffer layer 110, which is located at a lower side, to the planarization layer 118, which is located at an upper side.

Figure 4C:
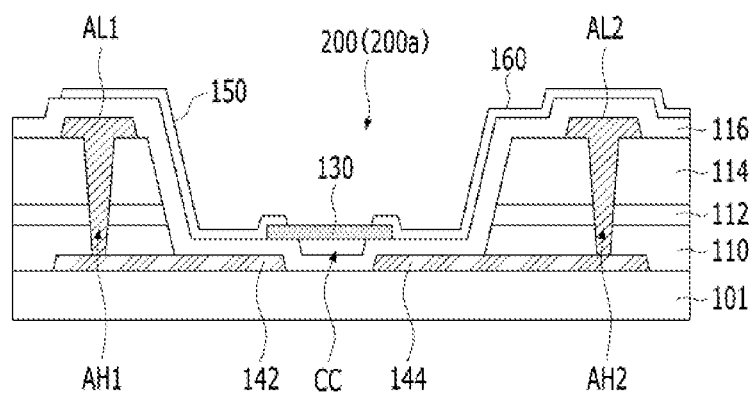

Alternatively, as shown in FIG. 4C, the trench 200 may include only the first trench 200a, which penetrates the buffer layer 110, the gate insulating film 112, and the interlayer insulating film 114, without the second trench 200b penetrating the planarization layer 118. The side surfaces of the buffer layer 110, the gate insulating film 112, and the interlayer insulating film 114 that are exposed by the first trench 200a are formed in the shape of a cup having an inclined surface, so the trench 200 may be formed such that the width thereof gradually increases from the buffer layer 110, which is located at a lower side, to the interlayer insulating film 114, which is located at an upper side.

The trench 200 may be formed to have a larger line width than a concave portion CC formed by the protective film 116.

Since the protective film 116 is formed of an inorganic insulating material, the protective film 116 may be formed to be curved along the surfaces of the first and second alignment electrodes 142 and 144 and the substrate 101 in the region corresponding to the space between the first and second alignment electrodes 142 and 144. In this case, the concave portion CC is defined by the curved surface of the protective film that corresponds to the space between the first and second alignment electrodes. The protective film 116 defining the concave portion CC has an inner surface IS, which faces the substrate 101, and side surfaces SS, which face the first and second alignment electrodes 142 and 144. In this case, the upper surface US of the protective film 116 that is disposed on each of the first and second alignment electrodes 112 and 114 may be disposed at a position higher than the inner surface IS of the protective film 116, which is exposed by the concave portion CC.

The trench with the concave portion CC may be formed in at least one of a plurality of insulating films, and the micro light-emitting diode may be disposed in the trench with the concave portion. Accordingly, side light, which is diffused to the side surface of the light-emitting device can be directed to the front direction of the display device, thereby improving light emission efficiency.

Also, in the display device according to the present disclosure, since the micro light-emitting diode is sprayed into the trench through an inkjet spray process, a separate partition wall structure can be omitted among the manufacturing processes, thereby reducing processing costs and the number of processes.

Figure 4D:
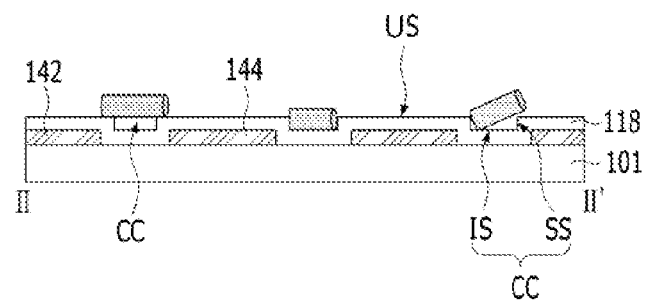
FIG. 4D is a cross-sectional view taken along line II-II' in FIG. 4A.

As shown in FIG. 4D, the light-emitting device 130 may be disposed on the protective film 116 defining the concave portion CC in various manners. Referring to FIG. 4D, the light-emitting device 130 may be disposed on the concave portion CC so as to be spaced apart from the inner surface IS of the concave portion CC and to overlap with each of the first and second alignment electrodes 142 and 144. Alternatively, the light-emitting device 130 may be inserted into the concave portion CC so as to overlap with each of the first and second alignment electrodes 142 and 144, or may be disposed at an incline within the concave portion CC so as to overlap with each of the first and second alignment electrodes 142 and 144.

FIGS. 5A to 6B are views showing a process of aligning the light-emitting device using the first and second alignment electrodes according to the present disclosure.

Figure 5A:
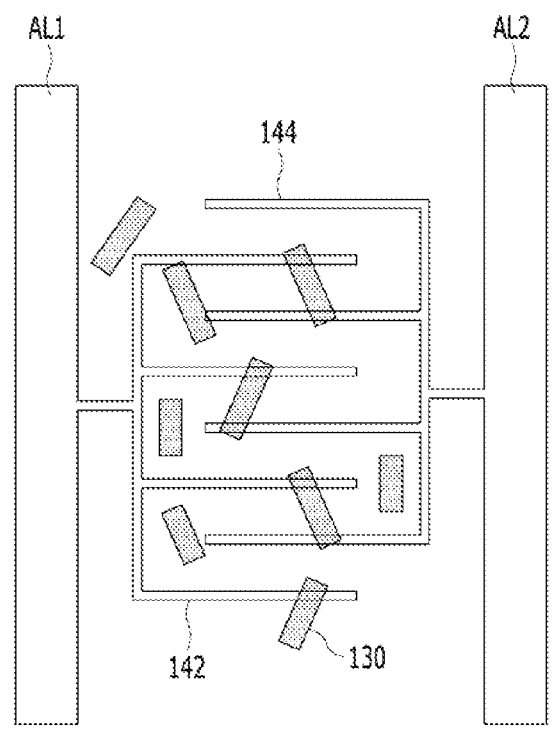
FIGS. 5A and 5B are views showing a process of performing inkjet printing on the light-emitting device shown in FIG. 1.
Figure 5B:
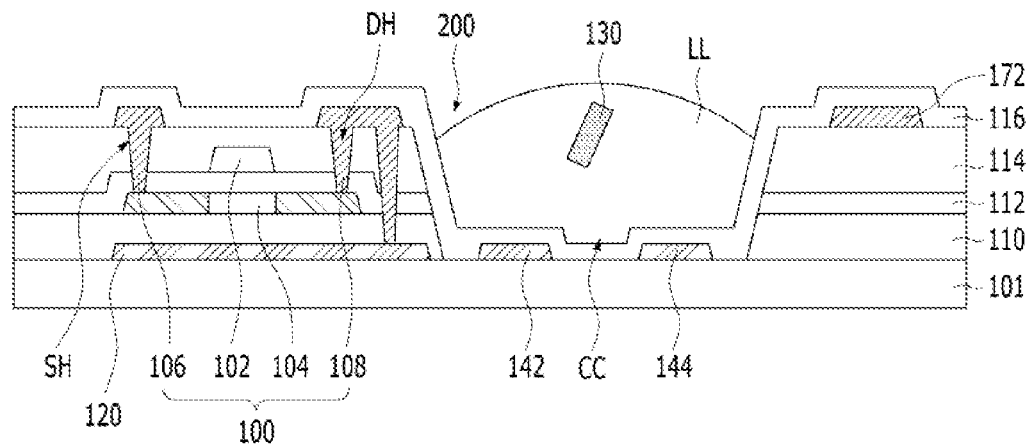

As shown in FIGS. 5A and 5B, the light-emitting device 130 may be sprayed into the trench 200 in the state of a solution mixed with a solvent LL through an inkjet printing process.

Figure 6A:
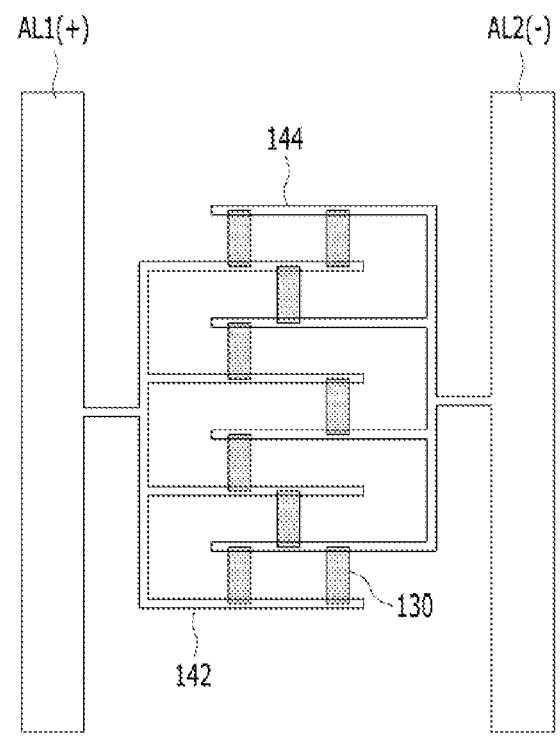
FIGS. 6A and 6B are views showing a process of aligning the light-emitting device shown in FIG. 1.
Figure 6B:
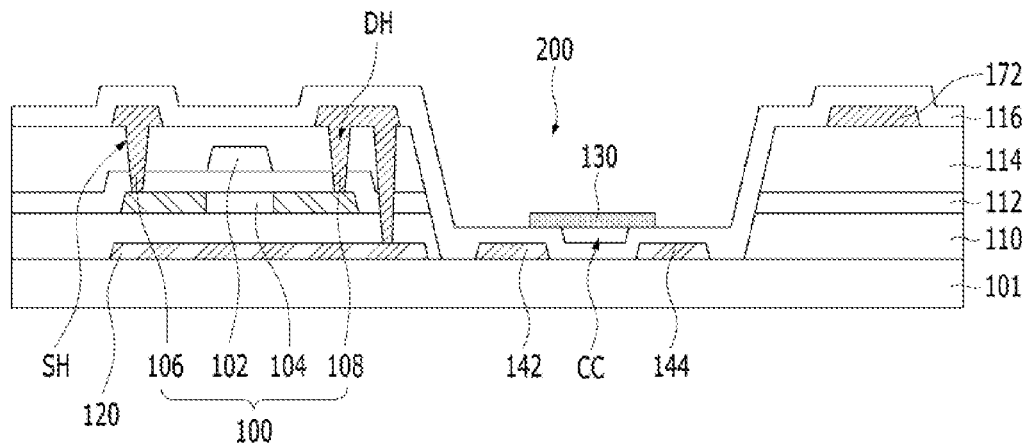

Subsequently, a first alignment signal of a positive (+) polarity is applied to the first alignment electrode 142 from the first alignment signal line AL1, and a second alignment signal of a negative (−) polarity is applied to the second alignment electrode 144 from the second alignment signal line AL2. At this time, since the first and second alignment signals have different voltages from each other, an electric field is formed between the first and second alignment electrodes 142 and 144 according to a potential difference between the first and second alignment electrodes 142 and 144. Bipolarity is induced in the light-emitting device 130 by the electric field, and a dielectrophoretic force is applied to a side of the light-emitting device 130 at which the gradient of the electric field is large or small. As shown in FIGS. 6A and 6B, the light-emitting device 130 is self-aligned between the first and second alignment electrodes 142 and 144 by the dielectrophoretic force. After the light-emitting device 130 is aligned, the solvent is vaporized and removed at room temperature or by heat applied thereto, with the result that the light-emitting device 130 is disposed between the first and second alignment electrodes 154 and 164.

As described above, in the display device according to the present disclosure, the trench 200 may be formed using at least one of the plurality of insulating films 110, 112, 114, 116 and 118 disposed between the substrate 101 and reflective electrodes 152 and 162. The first and second electrodes 150 and 160, which are reflective, may be disposed on the side surfaces of the plurality of insulating films 110, 112, 114, 116 and 118 that are exposed by the trench 200. Accordingly, in the display device according to the present disclosure, the emission efficiency of the light-emitting device 130 may be increased by the first and second electrodes 150 and 160 disposed on the plurality of insulating films 110, 112, 114, 116 and 118 exposed by the trench 200. In particular, in the display device according to the present disclosure, the first and second electrodes 150 and 160, which are reflective, concentrate light traveling to the non-emission area onto the emission area overlapping with the trench 200, thereby increasing emission efficiency.

In addition, in the display device according to the present disclosure, the light-emitting device 130 is sprayed into the trench 200 through an inkjet spray process, whereby it is possible to omit a separate partition wall structure, thereby reducing processing costs and the number of processes.

In addition, in the display device according to the present disclosure, the same number of light-emitting devices 130 is sprayed into each trench 200 in the state of a solution mixed with a solvent, whereby the same number of light-emitting devices 130 is disposed in each subpixel. Accordingly, the display device according to the present disclosure is capable of realizing uniform brightness of the subpixels.

Figure 7:
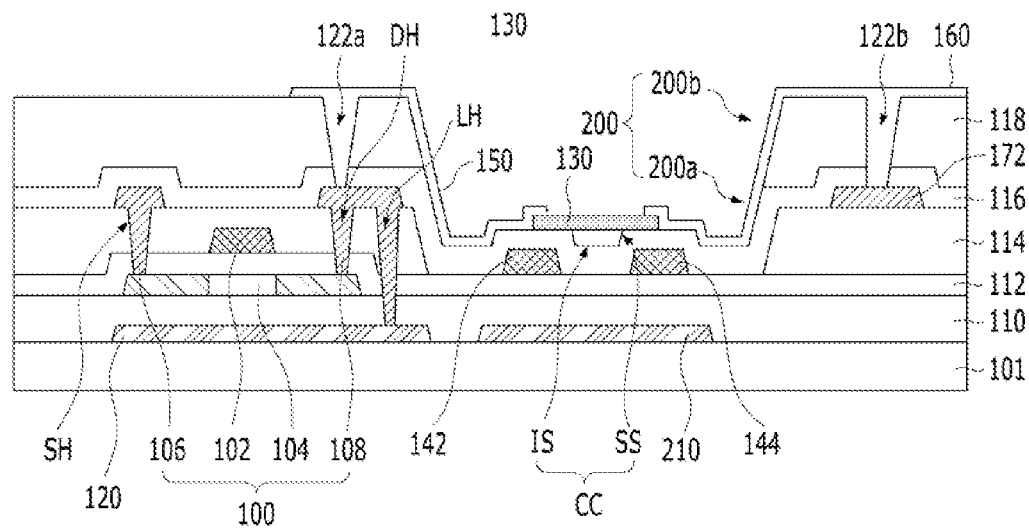
FIG. 7 is a cross-sectional view showing a display device according to a second aspect of the present disclosure.

FIG. 7 is a cross-sectional view showing a display device according to a second aspect of the present disclosure. With regard to the display device according to the second aspect of the present disclosure, a detailed description of the same components as those of the display device shown in FIG. 1 will be omitted.

As shown in FIG. 7, first and second alignment electrodes 142 and 144 may be disposed on a gate insulating film 112 that is exposed by the first trench 200a, which penetrates an interlayer insulating film 114. The first and second alignment electrodes 142 and 144 may be formed of the same material and in the same plane as a gate electrode 102.

A protective film 116 may be disposed on the first and second alignment electrodes 142 and 144, the gate insulating film 112, and the interlayer insulating film 114. The protective film 116 may be formed so as to cover the side surface of the interlayer insulating film 114 that is exposed by the first trench 200a.

Referring to FIG. 7, first and second electrodes 150 and 160 may be disposed on the upper surface of the protective film 116, which is disposed so as to cover the upper surface of the interlayer insulating film 114 and the side surface of the interlayer insulating film 114 that is exposed by the first trench 200a. In addition, the first and second electrodes 150 and 160 may be disposed on the upper surface of a planarization layer 118 and the side surface of the planarization layer 118 that is exposed by the second trench 200b. The first and second electrodes 150 and 160 are formed of a reflective material, so it is possible to concentrate light, emitted from the side surface of a light-emitting device 130 to a non-emission area, onto an emission area overlapping with the trench 200. Accordingly, in the display device, the light emission efficiency of the light-emitting device 130 is increased.

A lower reflective electrode 210 may be disposed on the substrate 101, and may be formed of the same material as a light-blocking layer 120. In addition, the lower reflective electrode 210 may be disposed in the same layer as the light-blocking layer 120. For example, the lower reflective electrode 210 may be disposed on the substrate 101, like the light-blocking layer 120. Referring to FIG. 7, the lower reflective electrode 210 may be disposed on the substrate 101 and a buffer layer 110. The lower reflective electrode 210 may be disposed so as to overlap with the light-emitting device 130. In addition, the lower reflective electrode 210 may be disposed so as to face the lower surface of the light-emitting device 130. Accordingly, the path of the light is changed such that the light emitted from the lower surface of the light-emitting device 130 to the substrate 101 is reflected by the lower reflective electrode 210 and travels to the trench 200, whereby the light is concentrated onto the emission area overlapping with the trench 200, with the result that emission efficiency is increased.

The light-emitting device 130 is disposed on the protective film 116 that covers the first and second alignment electrodes 142 and 144. Since the protective film 116 is formed of an inorganic insulating material, the protective film 116 may be formed to be curved along the surfaces of the first and second alignment electrodes 142 and 144 and the substrate 101 in the region corresponding to the space between the first and second alignment electrodes 142 and 144. In this case, a concave portion CC is defined by the curved surface of the protective film 116. The protective film 116 defining the concave portion CC has an inner surface IS, which faces the substrate 101, and side surfaces SS, which face the first and second alignment electrodes 142 and 144. In this case, the upper surface US of the protective film 116 disposed on each of the first and second alignment electrodes 112 and 114 may be disposed at a position higher than the inner surface IS of the protective film 116, which is exposed by the concave portion CC.

Figure 8:
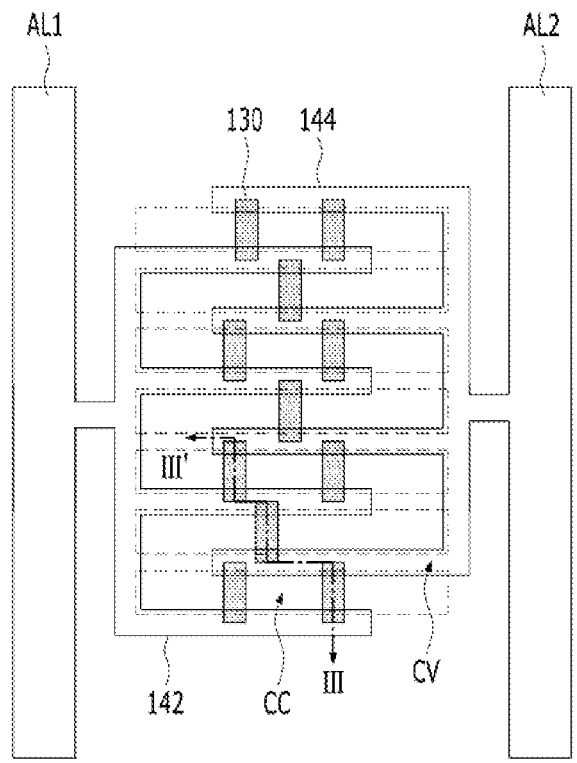
FIG. 8 is a plan view showing first and second alignment electrodes of a display device according to a third aspect of the present disclosure.
Figure 9:
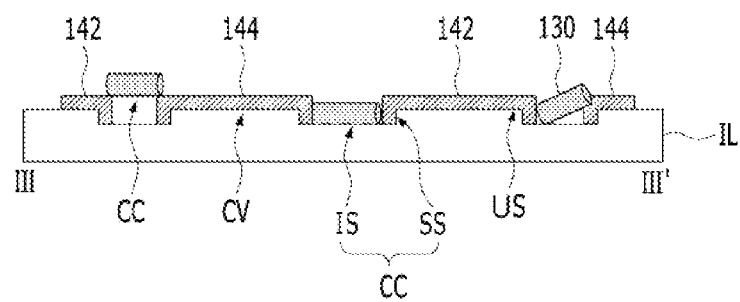
FIG. 9 is a cross-sectional view showing the first and second alignment electrodes of the display device according to the third aspect of the present disclosure.

FIGS. 8 and 9 are, respectively, a plan view and a cross-sectional view showing alignment electrodes of a display device according to a third aspect of the present disclosure. With regard to the display device according to the third aspect of the present disclosure, a detailed description of the same components as those of the display device shown in FIG. 1 will be omitted.

The first and second alignment electrodes 142 and 144 shown in FIGS. 8 and 9 may be disposed on an uneven-shaped alignment insulating film IL, which has a concave portion CC and a convex portion CV. The concave portion CC of the alignment insulating film IL may be provided in a plural number in each subpixel by removing the portions of the alignment insulating film IL that are located between the first and second alignment electrodes 142 and 144. The concave portions CC of the alignment insulating film IL may extend in the longitudinal direction of the first and second alignment electrodes 142 and 144, and may be disposed between the first and second alignment electrodes 142 and 144. The width of the concave portions CC may be less than or equal to the length of the light-emitting device 130.

The convex portion CV of the alignment insulating film IL may be provided in a plural number, and each of the convex portions CV may be disposed between the concave portions CC, and may extend in the longitudinal direction of the first and second alignment electrodes 142 and 144. In addition, the convex portions CV of the alignment insulating film IL may be disposed so as to overlap with the first and second alignment electrodes 142 and 144. The upper surface US of each of the convex portions CV may be disposed at a position higher than the inner surface IS of the alignment insulating film IL, which is exposed by the concave portions CC.

Each of the first and second alignment electrodes 142 and 144 may be disposed on the upper surface US of a respective one of the convex portions CV and the side surfaces SS of the alignment insulating film IL that are exposed by the concave portions CC. In addition, each of the first and second alignment electrodes 142 and 144 may cover the side surfaces SS of the alignment insulating film IL that are exposed by the concave portions CC. For example, the first alignment electrode 142 may cover the one side surface of the alignment insulating film IL that is exposed by one of the concave portions CC, and may extend so as to be disposed on the upper surface of the alignment insulating film IL. Accordingly, one side surface of the first alignment electrode 142 may be disposed on the upper surface of the alignment insulating film IL that is adjacent to the one side surface of the alignment insulating film IL, and the opposite side surface of the first alignment electrode 142 may be in contact with the inner surface IS of the alignment insulating film IL that is exposed by the one of the concave portions CC of the alignment insulating film IL. In addition, the second alignment electrode 144 may cover the opposite side surface of the alignment insulating film IL that is exposed by the one of the concave portions CC, and may extend so as to be disposed on the upper surface of the alignment insulating film IL. Accordingly, one side surface of the second alignment electrode 144 may be disposed on the upper surface of the alignment insulating film IL that is adjacent to the opposite side surface of the alignment insulating film IL, and the opposite side surface of the second alignment electrode 144 may be in contact with the inner surface IS of the alignment insulating film IL that is exposed by the one of the concave portions CC of the alignment insulating film IL. Accordingly, the surface areas of the first and second alignment electrodes 142 and 144 of the aspect, which are disposed on the alignment insulating film IL having the concave portions CC, are greater than the surface areas of the first and second alignment electrodes 142 and 144 of a comparative example, which are disposed on a flat plane. As shown in FIG. 9, the light-emitting device 130 may be disposed in each of the concave portions CC of the alignment insulating film IL, and may be in contact with the first and second alignment electrodes 142 and 144. As shown in FIG. 9, the light-emitting device 130 may be disposed in each of the concave portions CC of the alignment insulating film IL in various manners. Referring to FIG. 9, the light-emitting device 130 may be disposed on each of the concave portions CC so as to be spaced apart from the inner surface IS of each of the concave portions CC, and may overlap with the first and second alignment electrodes 142 and 144. Alternatively, the light-emitting device 130 may be inserted into each of the concave portions CC, and may overlap with the first and second alignment electrodes 142 and 144, or may be disposed at an incline within each of the concave portions CC, and may overlap with the first and second alignment electrodes 142 and 144.

In this way, the overlapping area between the light-emitting device 130 and each of the first and second alignment electrodes 142 and 144 increases due to the alignment insulating film IL having the concave portions CC and the convex portions CV. In particular, since the side surfaces of the first and second alignment electrodes 142 and 144 are also disposed on the side surfaces of the alignment insulating film IL that are exposed by the concave portions CC, the areas of the side surfaces of the first and second alignment electrodes 142 and 144 are greater than in the conventional art. In this case, contact between the light-emitting device 130 and each of the first and second alignment electrodes 142 and 144 is more reliably secured, so the number of light-emitting devices 130 that are in contact with each of the first and second alignment electrodes 142 and 144 and are aligned in each subpixel increases. Accordingly, in the present disclosure, the efficiency of the process of aligning the light-emitting devices 130 is improved, whereby the quantity of light emitted from the light-emitting devices 130 in each subpixel increases, consequently improving emission efficiency.

The alignment insulating film IL having the concave portions CC shown in FIG. 9 may be applied to any one of a plurality of insulating films disposed on the substrate 101. For example, in the present disclosure, the alignment insulating film IL may be applied to the planarization layer 118, as shown in FIG. 10, or may be applied to the gate insulating film 112, as shown in FIG. 11.

Figure 10:
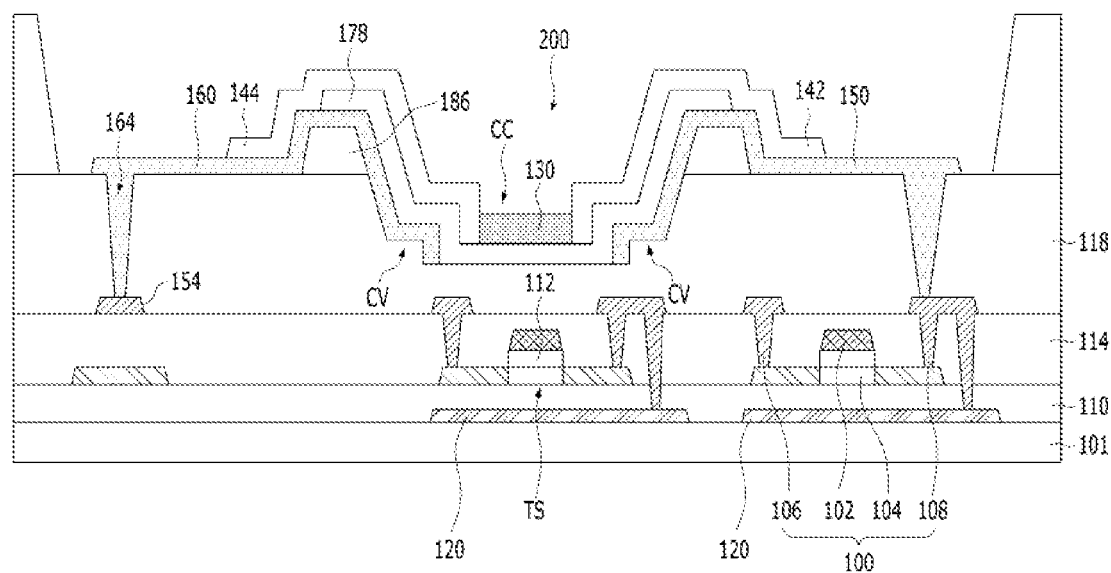
FIG. 10 is a cross-sectional view showing a first aspect of the display device to which the alignment insulating film shown in FIG. 9 is applied.
Figure 11:
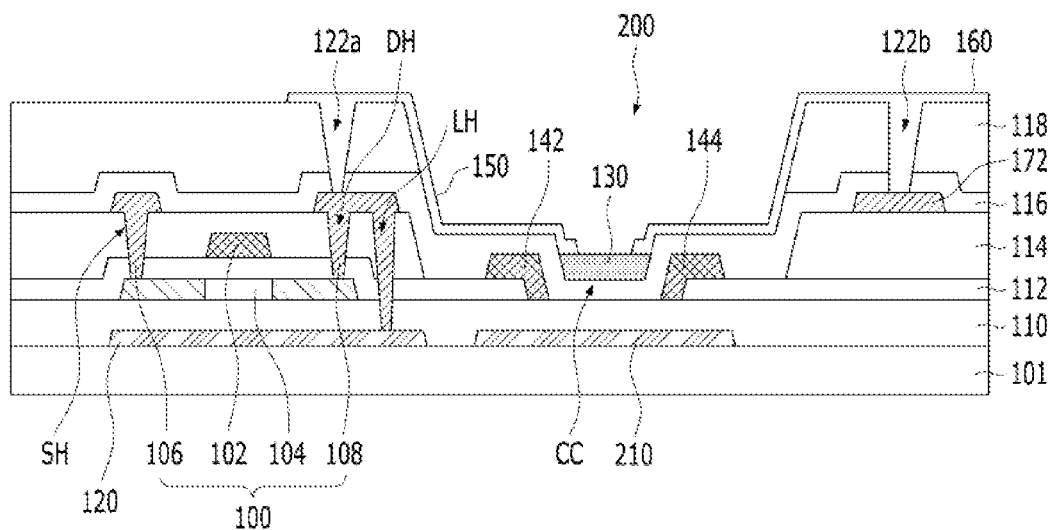
FIG. 11 is a cross-sectional view showing a second aspect of the display device to which the alignment insulating film shown in FIG. 9 is applied.

As shown in FIG. 10, the planarization layer 118, which covers a switching transistor TS and a driving transistor 100, may be formed to have a concave portion CC and a convex portion CV. An auxiliary protective film 178, which is disposed on the planarization layer 118, may be formed along the uneven-shaped planarization layer 118. Further, the auxiliary protective film 178 may be formed to have an uneven surface according to the uneven shape of the planarization layer 118.

The first and second alignment electrodes 142 and 144 may be disposed on the auxiliary protective film 178. Since the first and second alignment electrodes 142 and 144 are formed on the auxiliary protective film 178, which has an uneven surface, the surface areas of the first and second alignment electrodes 142 and 144 increase. In particular, since the side surfaces of the first and second alignment electrodes 142 and 144 are also disposed on the side surfaces of the alignment insulating film IL that are exposed by the concave portion CC, the areas of the side surfaces of the first and second alignment electrodes 142 and 144 are greater than in the conventional art. In this case, contact between the light-emitting device 130 and each of the first and second alignment electrodes 142 and 144 is more reliably secured, so the number of light-emitting devices 130 that are in contact with each of the first and second alignment electrodes 142 and 144 and are aligned in each subpixel increases. Accordingly, in the present disclosure, the efficiency of the process of aligning the light-emitting devices 130 is improved, whereby the quantity of light emitted from the light-emitting devices 130 in each subpixel increases, consequently improving emission efficiency.

Meanwhile, referring to FIG. 10, the first alignment electrode 142 may be connected to the first electrode 150, which is connected to the driving thin-film transistor 100, and the second alignment electrode 144 may be connected to the second electrode 160, which is connected to the low-voltage supply line 154 through the second contact hole 164. Since the first and second alignment electrodes 142 and 144 are disposed on the auxiliary protective film 178, the first and second alignment electrodes 142 and 144 are located at a position higher than the first and second electrodes 150 and 160.

Further, a partition wall 186 having a trench 200 may be additionally disposed on the planarization layer 118. Accordingly, the light-emitting device 130 is formed in a manner of performing spraying onto the emission area provided by the trench 200, which overlaps with the thin-film transistor TS (100), through an inkjet spray process, and is then aligned by the first and second alignment electrodes 142 and 144.

As shown in FIG. 11, the gate insulating film 112 may have a concave portion CC formed in the portion thereof that overlaps with the light-emitting device 130, and the buffer layer 110 may be exposed by the concave portion CC. The first and second alignment electrodes 142 and 144 may be disposed on the side surfaces of the gate insulating film 112 that are exposed by the concave portion CC formed in the gate insulating film 112. The first and second alignment electrodes 142 and 144 may cover the side surfaces of the gate insulating film 112, which are exposed by the concave portions CC. For example, the first alignment electrode 142 may cover the one side surface of the gate insulating film 112 that is exposed by the concave portion CC, and may extend so as to be disposed on the upper surface of the gate insulating film 112. Accordingly, one side surface of the first alignment electrode 142 may be disposed on the upper surface of the gate insulating film 112 that is adjacent to the one side surface of the gate insulating film 112, and the opposite side surface of the first alignment electrode 142 may be in contact with the upper surface of the buffer layer 110, which is exposed by the concave portion CC of the gate insulating film 112. In addition, the second alignment electrode 144 may cover the opposite side surface of the gate insulating film 112 that is exposed by the concave portion CC, and may extend so as to be disposed on the upper surface of the gate insulating film 112. Accordingly, one side surface of the second alignment electrode 144 may be disposed on the upper surface of the gate insulating film 112 that is adjacent to the opposite side surface of the gate insulating film 112, and the opposite side surface of the second alignment electrode 144 may be in contact with the upper surface of the buffer layer 110 that is exposed by the concave portion CC of the gate insulating film 112. In this way, the overlapping area between the light-emitting device 130 and each of the first and second alignment electrodes 142 and 144 increases due to the gate insulating film 112 having the concave portion CC. In particular, since the side surfaces of the first and second alignment electrodes 142 and 144 are also disposed on the side surfaces of the gate insulating film 112 that are exposed by the concave portion CC, the areas of the side surfaces of the first and second alignment electrodes 142 and 144 are greater than in the conventional art. In this case, the overlapping area between the light-emitting device 130 and each of the first and second alignment electrodes 142 and 144 is more reliably secured, so the number of light-emitting devices 130 overlapping with each of the first and second alignment electrodes 142 and 144 and are increased in each subpixel. Accordingly, in the present disclosure, the efficiency of the process of aligning the light-emitting devices 130 is improved, whereby the quantity of light emitted from the light-emitting devices 130 in each subpixel increases, consequently improving emission efficiency.

Figure 12:
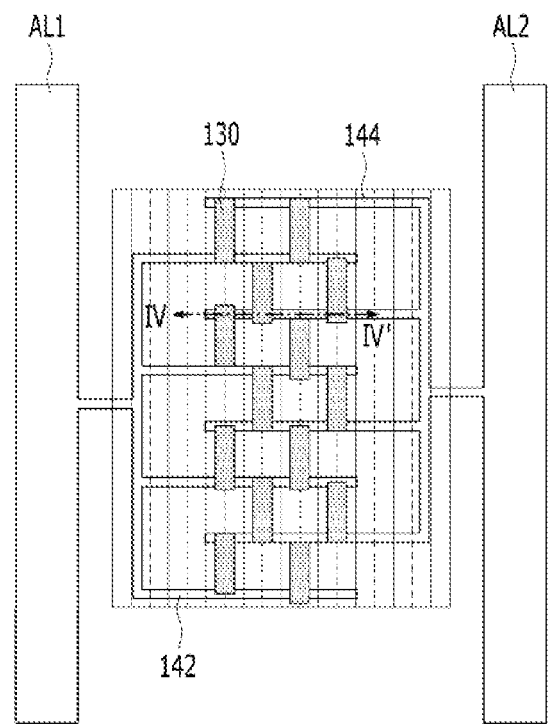
FIG. 12 is a plan view showing first and second alignment electrodes of a display device according to a fourth aspect of the present disclosure.
Figure 12:
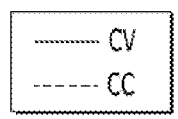
Figure 13:
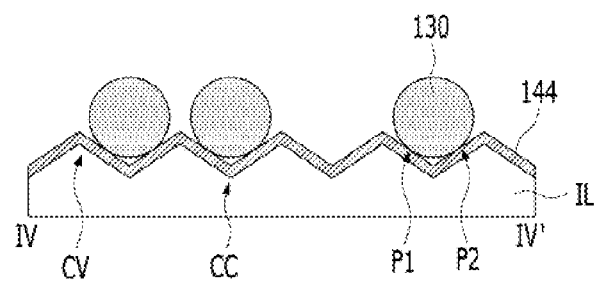
FIG. 13 is a cross-sectional view showing the first and second alignment electrodes of the display device according to the fourth aspect of the present disclosure.

FIGS. 12 and 13 are, respectively, a plan view and a cross-sectional view showing alignment electrodes of a display device according to a fourth aspect of the present disclosure. With regard to the display device according to the fourth aspect of the present disclosure, a detailed description of the same components as those of the display device shown in FIG. 1 will be omitted.

The first and second alignment electrodes 142 and 144 shown in FIGS. 12 and 13 may be disposed on an uneven-shaped alignment insulating film IL, which has a concave portion CC and a convex portion CV. The concave portion CC of the alignment insulating film IL may be provided in a plural number in each subpixel by removing the portions of the alignment insulating film IL that are located between the first and second alignment electrodes 142 and 144.

The concave portions CC of the alignment insulating film IL may extend in the width direction of the first and second alignment electrodes 142 and 144 (i.e. the longitudinal direction of the first and second alignment signal lines AL1 and AL2), and may be disposed so as to intersect the first and second alignment electrodes 142 and 144. Each of the concave portions CC of the alignment insulating film IL may have a V-shaped cross-section.

The convex portion CV of the alignment insulating film IL may be provided in a plural number, and each of the convex portions CV may be disposed between the concave portions CC. The convex portions CV of the alignment insulating film IL may also extend in the width direction of the first and second alignment electrodes 142 and 144 (i.e. the longitudinal direction of the first and second alignment signal lines AL1 and AL2), and may be disposed so as to intersect the first and second alignment electrodes 142 and 144.

Since each of the concave portions CC of the alignment insulating film IL has a V-shaped cross-section, the first and second alignment electrodes 142 and 144 are formed on the side surfaces of the alignment insulating film IL that are exposed by the concave portions CC, and thus have a V-shaped cross-section. In the comparative example, in which each of the first and second alignment electrodes 142 and 144 has a flat surface, the cylindrical-shaped light-emitting device is in contact at one point with each of the first and second alignment electrodes 142 and 144. In contrast, in the aspect of the present disclosure, in which each of the concave portions CC of the alignment insulating film IL has a V-shaped cross-section, the cylindrical-shaped light-emitting device is in contact at two or more points P1 and P2 with each of the first and second alignment electrodes 142 and 144.

In this way, the surface areas of the first and second alignment electrodes 142 and 144 increase due to the concave portions CC, and thus the overlapping area between the light-emitting device 130 and each of the first and second alignment electrodes 142 and 144 increases. In this case, contact between the light-emitting device 130 and each of the first and second alignment electrodes 142 and 144 is more reliably secured, so the number of light-emitting devices 130 that are in contact with each of the first and second alignment electrodes 142 and 144 and are aligned in each subpixel increases. Accordingly, in the present disclosure, the efficiency of the process of aligning the light-emitting devices 130 is improved, whereby the quantity of light emitted from the light-emitting devices 130 in each subpixel increases, consequently improving emission efficiency.

The alignment insulating film IL having the V-shaped concave portions CC shown in FIG. 13 may be applied to any one of a plurality of insulating films disposed on the substrate 101. For example, the alignment insulating film IL may be applied to a planarization layer 118 that is formed of an organic insulating material, in which it is easier to form the V-shaped uneven portions than in the case of an inorganic insulating material.

Figure 14:
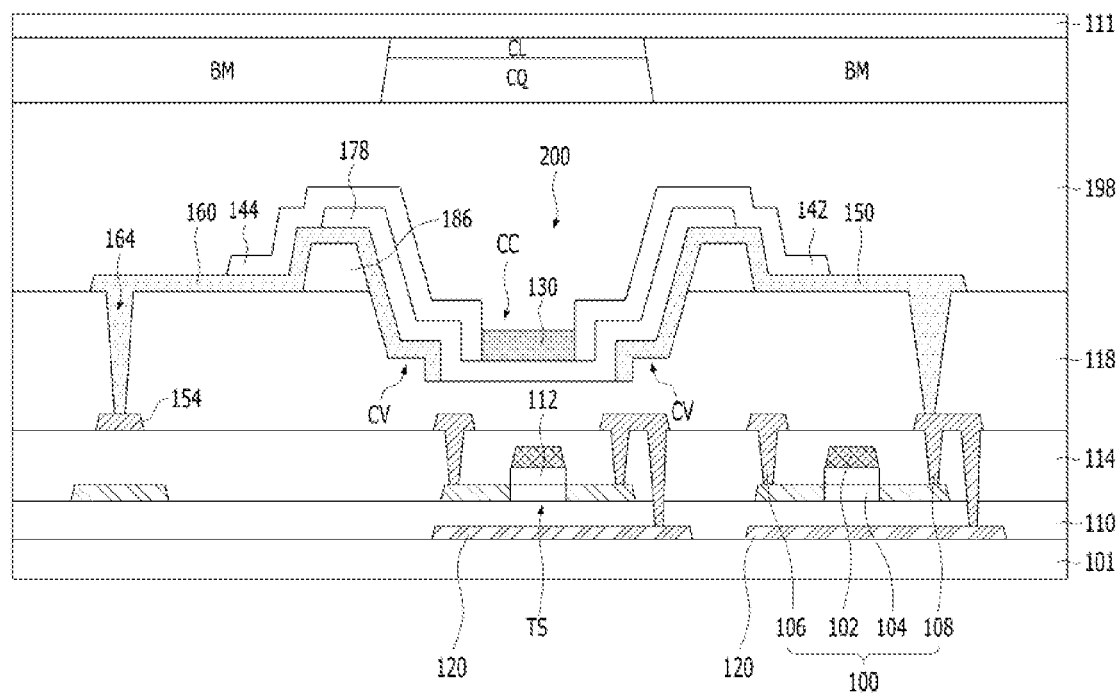
FIG. 14 is a cross-sectional view showing a first aspect of a color layer of the display device according to the present disclosure.

As shown in FIG. 14, the display device according to the present disclosure may further include a color unit including at least one of a first color layer CQ or a second color layer CL. In the present disclosure, a structure in which the first color layer CQ and the second color layer CL are sequentially stacked will be described by way of example.

The first color layer CQ is disposed on a second planarization layer 198 formed in order to planarize the substrate 101 on which the light-emitting device 130 is disposed. The first color layer CQ may include a red quantum dot layer disposed in a red subpixel area, a green quantum dot layer disposed in a green subpixel area, and a blue quantum dot layer disposed in a blue subpixel area.

The second color layer CL may be disposed on the first color layer CQ. The second color layer CL may include a red color filter disposed in the red subpixel area, a green color filter disposed in the green subpixel area, and a blue color filter disposed in the blue subpixel area.

Accordingly, white light having wavelengths of various colors, generated by the light-emitting device 130, passes through the first color layer CQ and is converted into light having the wavelength of a color corresponding to the first color layer CQ. Accordingly, because the white light generated by the light-emitting device 130 passes through the second color layer CL in the state of being converted into light having the wavelength of a color corresponding to the first color layer CQ, the amount of light absorbed by the second color layer CL, which is a color filter, decreases, so emission efficiency is improved.

Since blue light has higher energy than white light, it is difficult for the blue quantum dot to convert white light into blue light. Therefore, the first color layer CQ, which is composed of the blue quantum dot layer, may not be disposed in the blue subpixel area, but the second color layer CL, which is composed of the blue color filter, may be additionally disposed in the blue subpixel area. Accordingly, the second color layer in the blue subpixel area absorbs light of wavelengths other than blue light from the white light generated from the light-emitting device 130, and transmits only blue light.

A black matrix BM may be disposed between the color units, each of which includes the first and second color layers CQ and CL. The black matrix BM defines each subpixel area and prevents light interference and light leakage between adjacent subpixel areas. The black matrix BM is formed of a black insulating material having high resistance, or is formed by stacking at least two color filters among the red (R), green (G), and blue (B) color filters CL.

A cover substrate 111 is disposed on the substrate 101 on which the first and second color layers CQ and CL and the black matrix BM have been formed.

Figure 15:
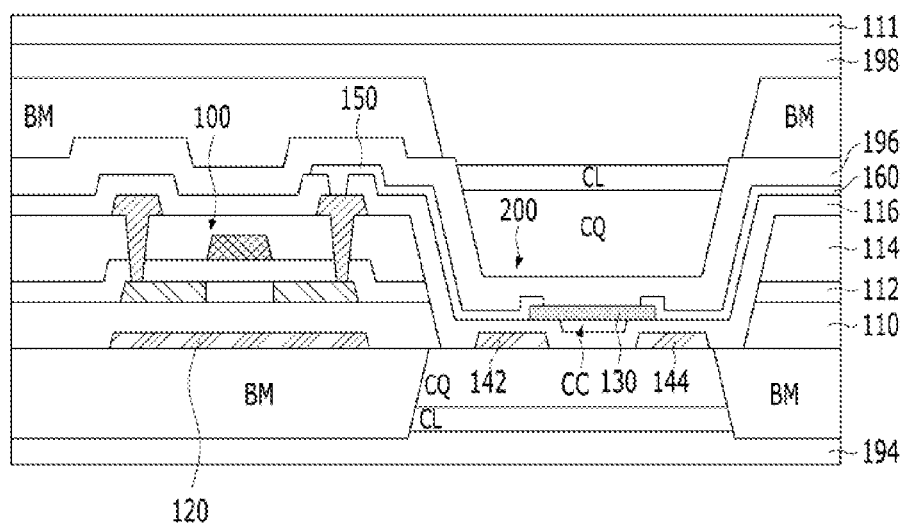
FIG. 15 is a cross-sectional view showing a second aspect of a color layer of the display device according to the present disclosure.
Figure 16:
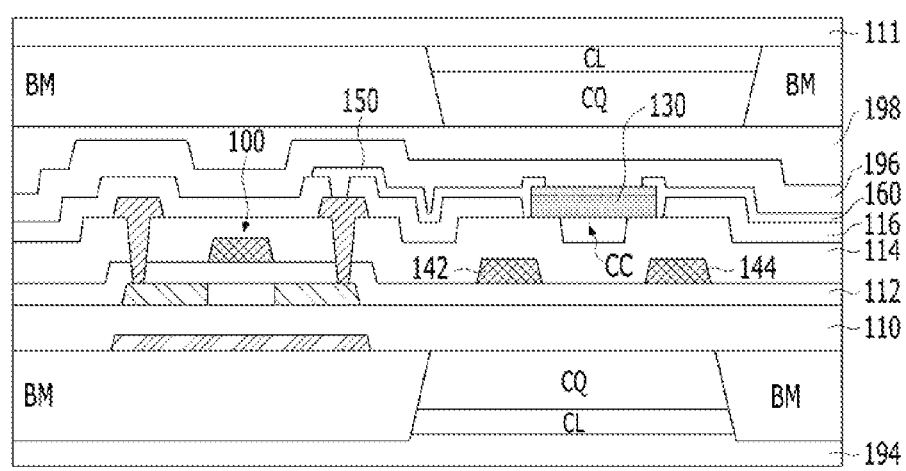
FIG. 16 is a cross-sectional view showing a third aspect of a color layer of the display device according to the present disclosure.

Meanwhile, in the display device according to the present disclosure, as shown in FIG. 15 or 16, the color units, each of which includes at least one of the first color layer CQ or the second color layer CL, may be disposed on the upper surface and the lower surface of the buffer layer 110 in order to implement double-sided light emission.

As shown in FIG. 15, the first and second color layers CQ and CL, which are disposed on the upper surface of the buffer layer 110, may be disposed under the second planarization layer 198. For example, the first and second color layers CQ and CL may be embedded in the trench 200. In this case, the second planarization layer 198 may eliminate a height difference between the first and second color layers CQ and CL and the black matrix BM, and the cover substrate 111 may be disposed on the flat surface of the second planarization layer 198.

As shown in FIG. 16, the first and second color layers CQ and CL, which are disposed on the upper surface of the buffer layer 110, may be disposed on the second planarization layer 198. The second planarization layer 198 is disposed on a second protective film 196 for fixing the light-emitting device 130.

As shown in FIGS. 15 and 16, the black matrix BM, which is disposed on the lower surface of the buffer layer 110, overlaps with the black matrix BM disposed on the upper surface of the buffer layer 110, and the first and second color layers CQ and CL, which are disposed on the lower surface of the buffer layer 110, overlap with the first and second color layers CQ and CL disposed on the upper surface of the buffer layer 110.

FIGS. 15 and 16 illustrate a structure in which the substrate 101 shown in FIG. 14 is omitted in order to reduce the thickness and to facilitate bending, with the color units and the black matrixes BM disposed on the upper surface and the lower surface of the buffer layer 110. However, the substrate 101 may be left behind, rather than being removed. In this case, the color units and the black matrixes BM may be disposed on the upper surface and the lower surface of the substrate 101.

Hereinafter, a method of manufacturing the display device according to the present disclosure will be described with reference to FIGS. 17A to 17D. The method of manufacturing the display device according to the present disclosure will be described based on the structure shown in FIG. 16.

Figure 17A:
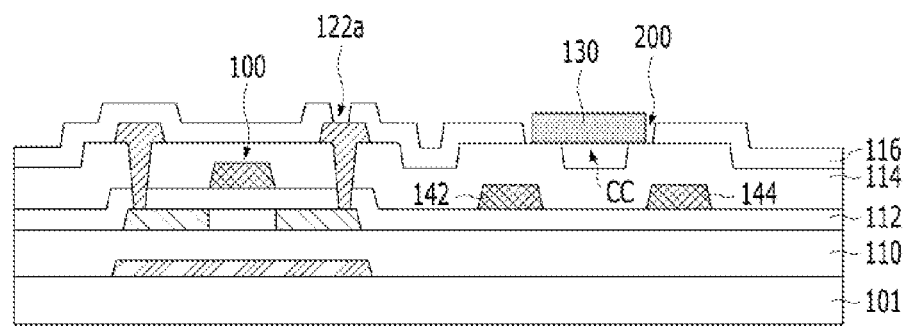
FIGS. 17A to 17D are cross-sectional views showing a method of manufacturing the display device according to the present disclosure.

First, as shown in FIG. 17A, first and second alignment electrodes 142 and 144, an interlayer insulating film 114 having a concave portion CC, a thin-film transistor 100, and a protective film 116 having therein a contact hole 122a and a trench 200 are formed on a substrate 101 through a plurality of mask processes. Subsequently, a light-emitting device 130 is sprayed onto the substrate 101, on which the trench 200 is formed, through an inkjet spray process (refer to FIGS. 5A and 5B), and the light-emitting device 130 is aligned between the first and second alignment electrodes 142 and 144 through an alignment process (refer to FIGS. 6A and 6B).

Figure 17B:
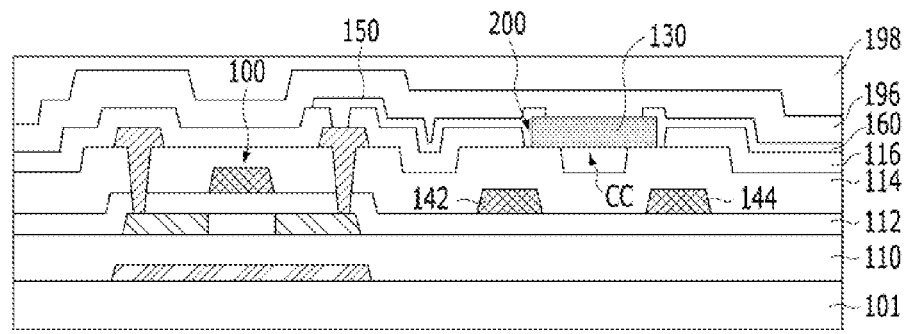

Subsequently, as shown in FIG. 17B, first and second electrodes 150 and 160 may be formed so as to be in contact with the light-emitting device 130, and thereafter, a second protective film 196 and a second planarization layer 198 may be sequentially formed. At this time, the first and second electrodes 150 and 160 may be disposed so as to fill the spaces between the light-emitting device 130 and the side surfaces of the protective film 116 that are exposed by the trench 200. In this case, the first electrode 150 may be in contact with one side surface of the light-emitting device 130 that is exposed by the trench 200, and may extend so as to be in contact with a portion of the upper surface of the light-emitting device 130. The second electrode 160 may be in contact with the opposite side surface of the light-emitting device 130 that is exposed by the trench 200, and may extend so as to be in contact with a portion of the upper surface of the light-emitting device 130.

Figure 17C:
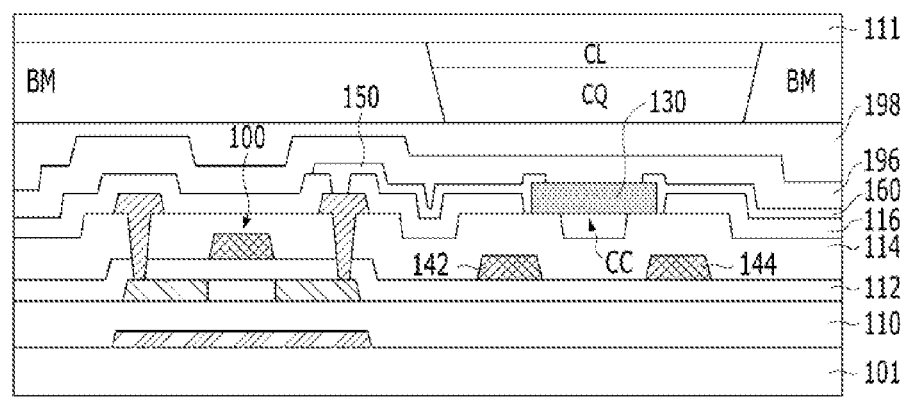

Subsequently, as shown in FIG. 17C, first and second color layers CQ and CL, a black matrix BM, and a cover substrate 111 may be sequentially disposed on the second planarization layer 198.

Figure 17D:
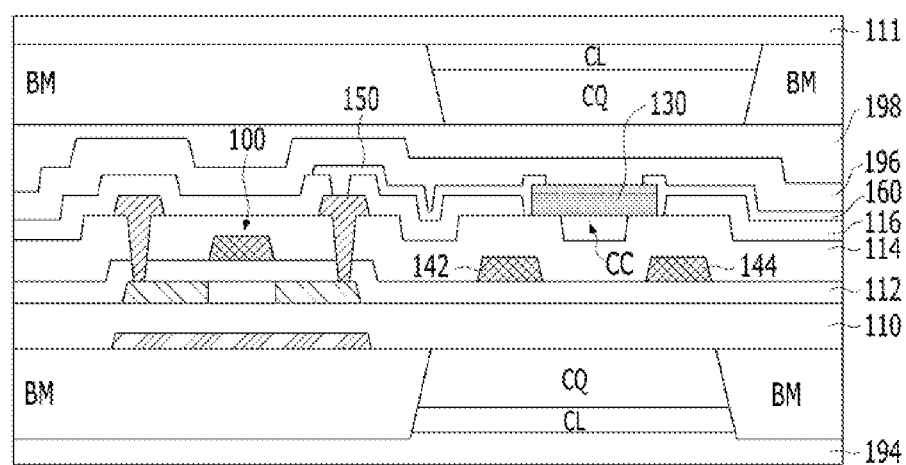

Subsequently, as shown in FIG. 17D, the substrate 101 is removed, and thereafter, first and second color layers CQ and CL, a black matrix BM, and a lower protective film 194 are sequentially disposed on the lower surface of the buffer layer 110, thereby completely manufacturing the display device.

In the completely manufactured display device, the light-emitting device 130 emits light in response to driving signals supplied through the first electrode 150, which serves as an anode, and the second electrode 160, which serves as a cathode, thereby representing an image.

As is apparent from the above description, in the display device according to the present disclosure, a trench is formed using at least one of a plurality of insulating films disposed between a substrate and a reflective electrode, and a light-emitting device is disposed in the trench. Accordingly, side light, which is diffused to the side surface of the light-emitting device can be directed to the front direction of the display device, thereby improving emission efficiency.

In addition, in the display device according to the present disclosure, since the light-emitting device is sprayed into the trench through an inkjet spray process, a separate partition wall structure can be omitted, thereby reducing processing costs and the number of processes.

In addition, in the display device according to the present disclosure, since alignment electrodes are disposed on the side surfaces of one of a plurality of insulating films exposed by the trench, the overlapping area between the light-emitting device and the alignment electrodes can be increased. Accordingly, the efficiency of a process of aligning the light-emitting device can be improved.

In addition, in the display device according to the present disclosure, since color layers are disposed on and under the light-emitting device, a double-sided light emission can be implemented.

It will be apparent to those skilled in the art that various modifications and variations can be made in the present disclosure without departing from the spirit or scope of the disclosure. Thus, it is intended that the present disclosure covers the modifications and variations of this disclosure provided they come within the scope of the appended claims and their equivalents.

What is claimed is:

1. A display device comprising:
   first and second alignment electrodes disposed on a substrate;
   an alignment insulating film having a concave portion disposed between the first and second alignment electrodes;
   a light-emitting device disposed on the alignment insulating film;
   first and second electrodes electrically connected to the light-emitting device;
   a thin-film transistor electrically connected to one of the first and second electrodes; and
   a plurality of insulating films having a trench disposed on the concave portion,
   wherein the trench has a larger width than the concave portion,
   wherein the first alignment electrode and the second alignment electrode are formed so as to protrude in a finger shape, and have an interdigitated or overlapping comb structure,
   wherein the alignment insulating film includes a protective film disposed on the thin-film transistor,
   wherein the plurality of insulating films includes:
   a buffer layer disposed under an active layer of the thin-film transistor;
   a gate insulating film disposed between the active layer of the thin-film transistor and a gate electrode of the thin-film transistor; and
   an interlayer insulating film disposed between source and drain electrodes of the thin-film transistor and the gate electrode of the thin-film transistor,
   wherein the trench exposes side surfaces of the buffer layer, the gate insulating film, and the interlayer insulating film and an upper surface of the substrate, and
   wherein the concave portion is defined by a curved surface of the protective film corresponding to a space between the first and second alignment electrodes.

2. The display device according to claim 1, wherein the trench overlaps with the concave portion and does not overlap with the thin-film transistor.

3. The display device according to claim 1, further comprising a light-blocking layer overlapping with the active layer of the thin-film transistor,
   wherein the first and second alignment electrodes are formed of a same material and disposed at a same plane as the light-blocking layer.

4. The display device according to claim 1, wherein the trench exposes side surfaces of the interlayer insulating film and an upper surface of the gate insulating film, and
   wherein the concave portion is defined by a curved surface of the protective film corresponding to a space between the first and second alignment electrodes.

5. The display device according to claim 4, wherein the first and second alignment electrodes are formed of a same material and disposed at a same plane as the gate electrode of the thin-film transistor.

6. The display device according to claim 1, wherein the trench overlaps with the concave portion and the thin-film transistor.

7. The display device according to claim 6, wherein the alignment insulating film includes a planarization layer disposed on the thin-film transistor, and
wherein the concave portion exposes an inner surface and side surfaces of the planarization layer.

8. The display device according to claim 1, wherein the concave portion is disposed between the first and second alignment electrodes in a longitudinal direction of the first and second alignment electrodes, and
wherein the concave portion includes a plurality of concave portions disposed in each subpixel.

9. The display device according to claim 8, further comprising a convex portion is disposed between the more than one concave portions, and
wherein the convex portion extends in the longitudinal direction of the first and second alignment electrodes and overlaps with the first and second alignment electrodes.

10. The display device according to claim 1, wherein the concave portion includes a plurality of concave portions disposed in each subpixel, and
wherein the plurality of concave portions intersects the first and second alignment electrodes in a width direction of the first and second alignment electrodes.

11. The display device according to claim 10, wherein a convex portion is disposed between the plurality of concave portions, and
wherein the convex portion extends in the width direction of the first and second alignment electrodes.

12. The display device according to claim 1, wherein the light-emitting device is disposed on an upper surface of the alignment insulating film and spaced apart from an inner surface of the alignment insulating film defining the concave portion.

13. The display device according to claim 1, wherein the light-emitting device is disposed in the concave portion and faces an inner surface and inner side surfaces of the alignment insulating film defining the concave portion.

14. The display device according to claim 1, wherein the light-emitting device is disposed at an incline within the concave portion.

15. The display device according to claim 1, wherein the first and second alignment electrodes are disposed on side surfaces of at least one of the plurality of insulating films exposed by the trench.

16. The display device according to claim 1, wherein the first and second electrodes fill up spaces between the light-emitting device and side surfaces of at least one of the plurality of insulating films exposed by the trench.

17. The display device according to claim 1, further comprising:
a plurality of color layers disposed on at least one of an upper surface or a lower surface of the substrate; and
a black matrix disposed between the plurality of color layers, the black matrix overlapping with the thin-film transistor.

18. The display device according to claim 17, wherein the plurality of color layers disposed on the upper surface of the substrate is disposed in the trench.

19. A display device comprising:
first and second alignment electrodes disposed on a substrate;
a protective layer having a concave portion;
a light-emitting device disposed on or having a portion embedded in the concave of the protective layer;
first and second electrodes electrically connected to the light-emitting device;
a thin-film transistor electrically connected to one of the first and second electrodes; and
a plurality of insulating layers having a trench directing the light-emitting device to a viewer direction,
wherein the plurality of insulating films includes:
a buffer layer disposed under an active layer of the thin-film transistor;
a gate insulating film disposed between the active layer of the thin-film transistor and a gate electrode of the thin-film transistor; and
an interlayer insulating film disposed between source and drain electrodes of the thin-film transistor and the gate electrode of the thin-film transistor,
wherein the trench exposes side surfaces of the buffer layer, the gate insulating film, and the interlayer insulating film and an upper surface of the substrate,
wherein the concave portion is extended from the trench and exposes the light-emitting device to a direction opposite to the viewer direction,
wherein the concave portion is defined by a curved surface of the protective layer corresponding to a space between the first and second alignment electrodes and the light-emitting device has a portion vertically overlapping with the first and second alignment electrodes, and
wherein the first alignment electrode and the second alignment electrode are formed so as to protrude in a finger shape, and have an interdigitated or overlapping comb structure.

20. The display device according to claim 19, wherein the trench has a cross-sectional width greater than that of the concave portion.

21. The display device according to claim 20, further comprising a light-blocking layer overlapping with an active layer of the thin-film transistor,
wherein the first and second alignment electrodes are formed of a same material and disposed at a same plane as the light-blocking layer is located.

22. The display device according to claim 1, further comprising:
a plurality of color layers disposed on at least one of an upper surface or a lower surface of the substrate; and
a black matrix disposed between the plurality of color layers and overlapping with the thin-film transistor.

23. The display device according to claim 22, wherein the plurality of color layers disposed on the upper surface of the substrate is disposed in the trench.

* * * * *